United States Patent
Poechmueller

(10) Patent No.: US 7,372,750 B2
(45) Date of Patent: May 13, 2008

(54) INTEGRATED MEMORY CIRCUIT AND METHOD FOR REPAIRING A SINGLE BIT ERROR

(75) Inventor: Peter Poechmueller, Dresden (DE)

(73) Assignee: Infineon Technologies AG, Munich (DE)

( * ) Notice: Subject to any disclaimer, the term of this patent is extended or adjusted under 35 U.S.C. 154(b) by 297 days.

(21) Appl. No.: 11/331,577

(22) Filed: Jan. 13, 2006

(65) Prior Publication Data

US 2006/0203567 A1    Sep. 14, 2006

(30) Foreign Application Priority Data

Jan. 13, 2005    (DE)    ............ 10 2005 001 520

(51) Int. Cl.
 *G11C 29/00*    (2006.01)
(52) U.S. Cl. .................................. 365/200; 365/201
(58) Field of Classification Search ........... 365/185.02, 365/185.04
See application file for complete search history.

(56) References Cited

U.S. PATENT DOCUMENTS

| | | | |
|---|---|---|---|
| 5,598,373 A * | 1/1997 | Wada et al. ............ | 365/230.03 |
| 6,650,583 B2 * | 11/2003 | Haraguchi et al. ......... | 365/201 |
| 7,085,182 B2 * | 8/2006 | Collura et al. ............... | 365/201 |
| 7,155,643 B2 * | 12/2006 | Ichikawa ................... | 714/710 |

FOREIGN PATENT DOCUMENTS

| | | |
|---|---|---|
| DE | 197 25 581 C2 | 1/1999 |
| DE | 102 14 209 A1 | 10/2003 |

* cited by examiner

*Primary Examiner*—Tan T. Nguyen
(74) *Attorney, Agent, or Firm*—Patterson & Sheridan, L.L.P.

(57) ABSTRACT

The invention relates to an integrated memory circuit having a memory cell array comprising memory cells arranged on word lines and bit lines, and having a repair circuit for repairing a single bit error in one of the memory cells, the repair circuit comprising: an error memory for storing an item of repair information, an assignment unit in order, when accessing an address of the memory cell array, depending on the repair information, to access either a memory area of the memory cell array or a redundancy memory area, and a test unit for determining the repair information. The test unit comprises a write unit, which successively writes first test data and second test data to a plurality of memory cells of a memory area of the memory cell array, a read-out unit which reads out data stored in the memory area, a modification unit in order to modify the bits of the read-out data in such a way that the position of each bit changes and each of the bits is inverted in order to provide the second test data, which are subsequently written to the memory area with the aid of the write unit, and a comparator unit in order to compare the data read out after the writing of the second test data with expected data and to provide the repair information depending on the comparison result.

16 Claims, 2 Drawing Sheets

INTEGRATED MEMORY CIRCUIT AND METHOD FOR REPAIRING A SINGLE BIT ERROR

CROSS-REFERENCE TO RELATED APPLICATIONS

This application claims foreign priority benefits under 35 U.S.C. §119 to co-pending German patent application number DE 10 2005 001 520.4, filed 13 Jan. 2005. This related patent application is herein incorporated by reference in its entirety.

BACKGROUND OF THE INVENTION

1. Field of the Invention

The invention relates to an integrated memory circuit having a memory cell array and a repair circuit for repairing a single bit error. The invention furthermore relates to a method for repairing a single bit error in an integrated memory circuit.

2. Description of the Related Art

Memory cells of integrated memory circuits, in particular of DRAM memory circuits, may be subject to degradation if they are exposed to method steps with high temperatures, such as may occur for example during packaging or soldering. It can happen, therefore, that in the case of previously tested and error-free memory circuits, after assembly to form a module, memory cells fail and single bit errors thereby occur which render the module unusable and have a considerable effect on the yield in the production of memory modules. Such memory modules are therefore repaired by means of a repair circuit, these then being programmed manually with the aid of an electrical fuse and subsequently being tested anew. The repair with the aid of an electrical fuse is carried out by means of an external access. The repair usually requires a renewed test, the storage of an error address in an error address memory and the subsequent repair by writing to the fuse in order to repair the defective memory cell determined previously. This procedure is complicated and represents a considerable cost factor in the production of a memory module having a plurality of memory circuits.

SUMMARY OF THE INVENTION

It is an object of the present invention to provide an integrated memory circuit which enables a better yield in the case of assembly to form a memory module. It is furthermore an object of the present invention to provide a method which makes it possible to repair single bit errors in an integrated memory circuit after assembly to form a memory module.

A first aspect of the present invention provides an integrated memory circuit having a memory cell array and a repair circuit. The memory cell array has memory cells arranged on word lines and bit lines. The repair circuit serves for repairing a single bit error in one of the memory cells of the memory cell array and comprises an error memory for storing an item of repair information, an assignment unit in order, when accessing an address of the memory cell array, depending on the repair information, to access either a memory area of the memory cell array or a redundancy memory area, and a test unit for determining the items of repair information. The test unit comprises a write unit, which successively writes first test data and second test data to a plurality of memory cells of a memory area of the memory cell array, a read-out unit, which reads out data stored in the memory area, a modification unit in order to modify the bits of the read-out data in such a way that the position of each bit changes and each of the bits is inverted in order to provide the second test data, which are subsequently written to the memory area with the aid of the write unit, a comparator unit in order to compare the data read out after the writing of the second test data with expected data and to provide the repair information depending on the comparison result.

The integrated memory circuit of the present invention enables an automatic repair of a single bit error in one of the memory cells of the memory cell array with the aid of a repair circuit, which carries out a simple test sufficient for determining a single bit error that occurs on account of degradation of a memory cell. Such a single bit error is usually manifested in the fact that after a thermal stress, either a logic "1" or a logic "0" can no longer be stored in the defective memory cell. In order to be able to ascertain such an error, it is therefore necessary, in a test method, to check whether a logic "0" and a logic "1" can be reliably stored in each memory cell, in order to be able to ascertain that the memory cell is free of errors. A corresponding test of the memory cells therefore has to be carried out by writing a logic "0" and a logic "1" to each of the memory cells and a subsequent read-out. The method according to the invention provides, then, firstly for writing first test data to a memory area and then for reading them out, the read-out data being modified by inverting them and changing the data bits in terms of their position, and being written as second test data to the memory cells. Consequently, testing of the storage of a logic "0" and a logic "1" is performed for each of the memory cells.

In order that an error in the case of which neither a logic "0" nor a logic "1" can be stored in the defective memory cell does not have the effect that the detected errors cancel one another out, the data read out after the writing of the first test data are modified in such a way that the position of each bit of the read-out data changes before the latter are written as second test data (in inverted fashion) to the memory area again. Since generally only single bit errors are to be expected anyway in the course of testing at the module level in the memory circuit to be tested (the probability of a plurality of memory cells failing is very low), it is possible, by comparing the data read out after the writing of the second test data with the expected data, to ascertain whether at least one error has occurred in the tested memory area. Since the repair circuit is provided in such a way that the entire memory area is replaced by a redundancy memory area as soon as an error has been detected, it is not necessary to determine the precise position of the single bit error in the memory area. The memory circuit according to the invention thus makes it possible, by the provision of a test unit configured in a simple manner, to determine an item of repair information by means of which, with the aid of the repair circuit, it is possible to repair a single bit error in the integrated memory circuit.

In accordance with a further embodiment of the invention, the repair circuit may have a programming circuit for writing to the error memory depending on the repair information. In particular, the error memory may in this case have a permanent memory that stores the stored information independently of an application of a supply voltage. The permanent memory is preferably formed as an electrical fuse.

It may be provided that a test data provision unit provides the first test data as a bit sequence. In particular, the test data provision unit may provide a sequence of identical logic states as first test data, the expected data provided to the comparator unit corresponding to the inverted first test data.

A further aspect of the present invention provides an integrated memory circuit having a memory cell array and having a repair circuit for repairing a single bit error in one of the memory cells of the memory cell array. The repair circuit comprises an error memory for storing an item of repair information, an assignment unit in order, when accessing an address of the memory cell array, depending on the repair information, to access either a memory area of the memory cell array or a redundancy memory area, and a test unit for determining the repair information. The test unit comprises a write unit, which successively writes first test data and second test data to a plurality of memory cells of a memory area of the memory cell array, a read-out unit which reads out data stored in the memory area, a comparator unit in order to compare the data read out after the writing of the second test data with expected data and to provide the repair information depending on the comparison result, and an interface unit in order to receive the first and second test data externally from the outside and to transmit the read-out data externally toward the outside. Furthermore, an expected data provision unit is provided in order to provide the expected data.

The integrated memory circuit in accordance with this aspect of the present invention has the advantage that the circuitry outlay for repairing the memory circuit is very low since only the repair on the basis of the repair information is performed within the integrated memory circuit, but not the provision of the test data, e.g. by means of a so-called BIST circuit. For this purpose, an interface unit is provided which is connected to an external test data unit, so that the testing of the memory cell array is performed by the external tester unit. The external tester unit makes the first and second test data available in such a way that the data stored after the writing of the second test data in the memory cell array correspond to the expected data provided by the expected data provision unit. In the case where the data stored in a memory area in the memory cell array deviate from the expected data, an error is detected, which leads to the generation of the repair information, as a result of which the relevant memory area is replaced by a redundant memory area.

A further aspect of the present invention provides a test system having an external tester unit and an integrated memory circuit to be repaired. The test system provides the first test data and reads out the written first test data from the integrated memory circuit. The tester unit generates the second test data by each bit of the read-out data being inverted and altered in terms of its position, and the second test data being provided to the integrated memory circuit.

A further aspect of the present invention provides a method for repairing a single bit error in an integrated memory circuit having a memory cell array. The method comprises the steps of writing first test data to a memory area of the integrated memory circuit, reading out the data from the memory area, modifying the read-out data by inverting the data bits of the memory area and changing them in terms of their position, writing the modified data once again to the memory area, reading out the data once again from the memory area, comparing the data read out after the writing of the second test data with expected data and providing the repair information depending on a result of the comparison.

The method according to the invention represents a simple possibility for automatically detecting a single bit error in a memory area of an integrated memory circuit and making available an item of repair information in this regard. The repair information serves for replacing the memory area having the defective memory cell by a redundancy memory area by programming of an error memory.

It may be provided that the repair information is stored permanently.

In accordance with one preferred embodiment, either a memory area of the memory cell array or a redundancy memory area is accessed when accessing an address of the memory cell array, depending on the repair information.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
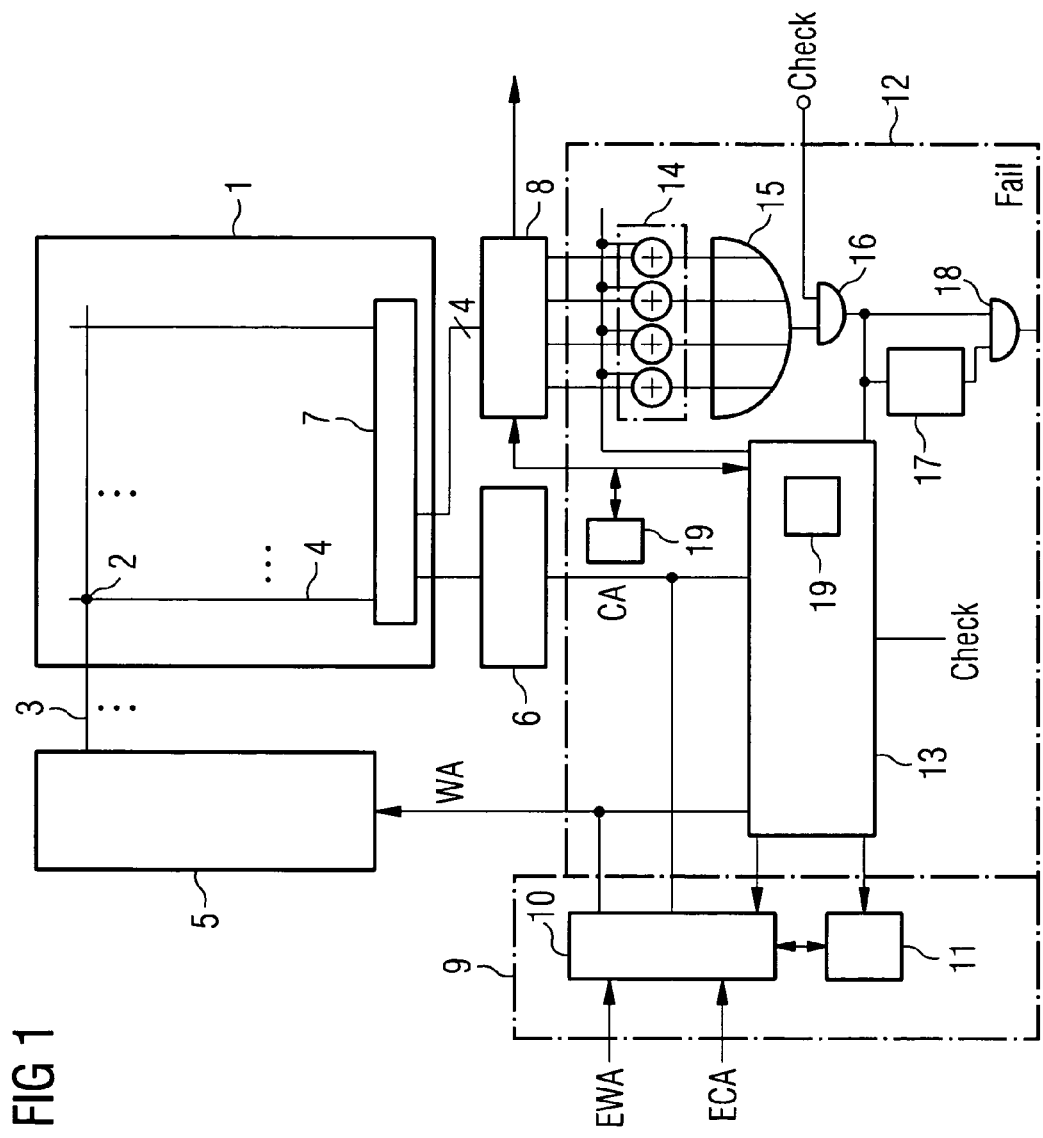
FIG. 1 shows a block diagram of an integrated memory circuit in accordance with one preferred embodiment of the invention.

FIG. 1 shows a block diagram of an integrated memory circuit in accordance with one preferred embodiment of the invention. The memory circuit comprises a memory cell array 1 having memory cells 2 which are arranged on word lines 3 and bit lines 4. The word lines 3 and the bit lines 4 form a matrix in which each memory cell 2 can be addressed by one of the word lines 3 and one of the bit lines 4. In the exemplary embodiment illustrated, the memory cells are preferably DRAM memory cells. However, it is also possible to provide any other memory cells which can be addressed via word lines 3 and bit lines 4. The word lines 3 are connected to a word line decoder 5, which, depending on a word line address WA, selects one of the word lines and activates the relevant word line 3 for accessing the addressed memory cell. With the aid of a column address CA, which is fed to a bit line decoder 6, the addressed bit lines are connected via a first sense amplifier 7 to a second sense amplifier 8, so that the data stored in the addressed memory cells 2 are read into the second sense amplifier 8. The first sense amplifier 7 essentially has individual sense amplifiers which are in each case coupled to a bit line pair in order to detect a charge difference on the bit line after activation of a corresponding word line 3 and to provide it at a respective output of the individual sense amplifiers. By means of the column address CA, the output/outputs of the relevant individual sense amplifier/amplifiers is/are then selected and connected to the second sense amplifier 8. In the present case, four data bits are read out simultaneously into the second sense amplifier 8. The second sense amplifier 8 serves for amplifying the read-out datum supplied by the sense amplifier 7. Furthermore, the second sense amplifier 8 serves for storing the read-out datum in a latch, so that it can be retrieved synchronously with a clock signal.

If such an integrated memory circuit is incorporated into a memory module, this is often done with the aid of connecting techniques which expose the memory circuits to a thermal step, as is the case for example during soldering. Such a thermal step may lead to degradation of memory cells, as a result of which the data storage capability of the memory cell is impaired or destroyed. After assembly of the memory circuit to form a memory module, so-called single bit errors often occur, which are manifested in a memory cell lacking a storage capability with regard to a logic "1" and/or a logic "0".

In order that, after assembly of the memory module, such a single bit error in one of the memory circuits does not have the effect that the memory module becomes unusable, the invention provides a repair circuit 9, which repairs a defective memory cell by means of a readdressing of the memory area having the defective memory cell by virtue of the fact that when the defective memory area is addressed, a redundant memory area that is likewise situated in the memory cell array 1 is addressed. The redundant memory area can be addressed by means of corresponding word line addresses WA and column addresses CA. For this purpose, the repair circuit 9 has a first address input to an assignment unit 10 for receiving an external word line address EWA and a second address input to the assignment unit 10 for receiving an external column address ECA, which, depending on an error address memory 11, forwards the external word line address EWA and external column address ECA as word line address WA and column address CA, respectively, to the word line decoder 5 and the bit line decoder 6, respectively, or a corresponding error word line address FWA and error column address FCA. The error address stored in the error address memory 11 specifies the memory area in which a single bit error has been detected and which is to be replaced by a redundant memory area in the event of an access, and the redundant memory area is addressed instead of the defective memory area.

The detection of the single bit error is performed with the aid of a test circuit 12. The test circuit 12 has a test control unit 13, which, in accordance with a test mode, checks the memory locations of the memory cell array 1 for single bit errors. For this purpose, the test control unit 13 generates word line addresses WA and column addresses CA and applies them to the word line decoder 5 and to the bit line decoder 6, respectively. Furthermore, the test control unit 13 is connected to the second sense amplifier 8, so that the test data which are to be written to the memory areas to be tested can likewise be prescribed by the test control unit 13. A modification unit 19 is provided in order to modify the data read out from the addressed memory area and to provide them to the second sense amplifier 8 once again, so that the latter can write the modified data once again.

The second sense amplifier 8 is connected to a comparator circuit 14, in which the data read out from the memory area are compared with expected data, which are likewise provided by the test control unit 13, and the comparison result for each of the data bits of the read-out data is fed to an OR gate 15, a logic "1" specifying a difference between the corresponding bit of the read-out data and the corresponding expected datum and, consequently, an error. An output of the OR gate 15 thus outputs a logic "1" if an error has been detected in the course of comparison in one of the memory cells of the memory area. The output of the OR gate 15 is connected to a first AND gate 16 in order to feed the output of the OR gate 15, depending on a check signal Check, to an input of a latch 17 and to a first input of a second AND gate 18. An output of the latch 17 is connected to a second input of the second AND gate 18.

The test control unit 13 then carries out a test method in order to detect a single bit error in the memory cell array 1. For this purpose, memory areas of the memory cell array 1 are tested successively. The test method provides firstly for sending first test data from the text circuit 12 to the second sense amplifier 8, from where the first test data are written to a word line address and column address CA prescribed by the test control unit 13, and the written data are subsequently read out from the memory area. The read-out data are modified in the modification unit 19 and, via the second sense amplifier 8, are written as second test data to the memory area once again. The second test data that has been written once again are then read out into the second read-out unit 8 and made available to the comparator unit 14, where the read-out data are compared with expected data, which are provided by the test control unit 13, and an error is ascertained if one of the data bits of the read-out data deviates from the corresponding data bit of the expected data.

By virtue of an activated check signal Check at the corresponding input of the first AND gate 16 (logic "1"), an error that has occurred brings about a logic "1" at the output of the first AND gate 16, which has the effect that the test control unit 13 programs the error address memory 11 in such a way that the defective memory area found, which is identified by the word line address WA and the column address CA, is marked as defective and, when this memory area is subsequently addressed, a redundant memory area with a different word line address and column address is addressed instead. The check signal Check is likewise generated by the test control unit 13 and activated after each test cycle of a memory area, so that it is possible to repair an error in a memory area directly after the testing thereof. The test cycle is preferably carried out for all the memory areas, irrespective of whether or not a single bit error has already been found. Upon the first occasion that a single bit error is found, a logic "1" is stored in the latch 17, so that, upon a further occasion of finding a single bit error in a different memory area, both inputs of the second AND gate 18 are at a logic "1" and, consequently, the output of the second AND gate 18 correspondingly likewise outputs a logic "1", whereby an error signal Fail is generated, specifying that a further single bit error has occurred, which cannot be automatically repaired in the memory circuit. The memory module in which the corresponding memory circuit is used must be rejected in this case.

It goes without saying that it is possible to provide a plurality of error address memories 11 (number X) such that it is possible to repair a plurality of single bit errors in a plurality of memory areas. In this case, a shift register is to be provided instead of the latch 17, which shift register outputs a logic "1" only upon an X-th occasion of finding an error, at a corresponding output connected to the respective input of the AND gate 18.

The modification unit 19 is preferably configured in such a way that the data bits of the data read out after the writing of the first test data are changed in terms of their position in such a way that as far as possible no data bit remains at its original position. By way of example, this can be carried out by rotating or shifting the data bits of the read-out data. Moreover, the read-out data are individually inverted in order thus to generate the second test data. A series of logic zeros are preferably made available as first test data, so that data bits having logic zeros are read out when reading out the data from the addressed memory area in the error-free case. If an error occurs, then this can be identified by the fact that one of the data bits of the read-out data has a logic "1" instead of a logic "0". In order that, after the read-out data have been inverted and written in once again as second test data, a further error does not prevent the detection of the error already detected, in the modification unit 19 provision is made for the position of each of the data bits to be changed, preferably through rotation of the data bits.

Since it is generally assumed that only a single bit error occurs in the memory circuit or in the memory area, an inverted logic "0" that is to say a logic "1", is then written to the defective memory cell of the memory area as a second test datum. By once again reading from the memory area and comparing the read-out data bits with the expected data, it is possible to ascertain whether an error occurred during storage of a logic "0" or a logic "1". The expected data have only logic ones in this example.

Instead of the previously described example for test data, any other test data patterns may also be used. By way of example, the test operation described can be carried out with a series of logic ones or a sequence of alternately a logic "1" and a logic "0" and vice versa as first test datum, the respective expected data corresponding to the test data that have been inverted and correspondingly changed in terms of their position.

A memory that stores the error address permanently in a suitable form is preferably to be provided as the error address memory 11. In particular, an electrical fuse that can be written to via the test control unit 13 is to be provided as the error address memory. The electrical fuse has the advantage that the setting stored therein can generally no longer be altered, so that changes to the settings can no longer be performed subsequently by the end user of the memory module.

Figure 2:
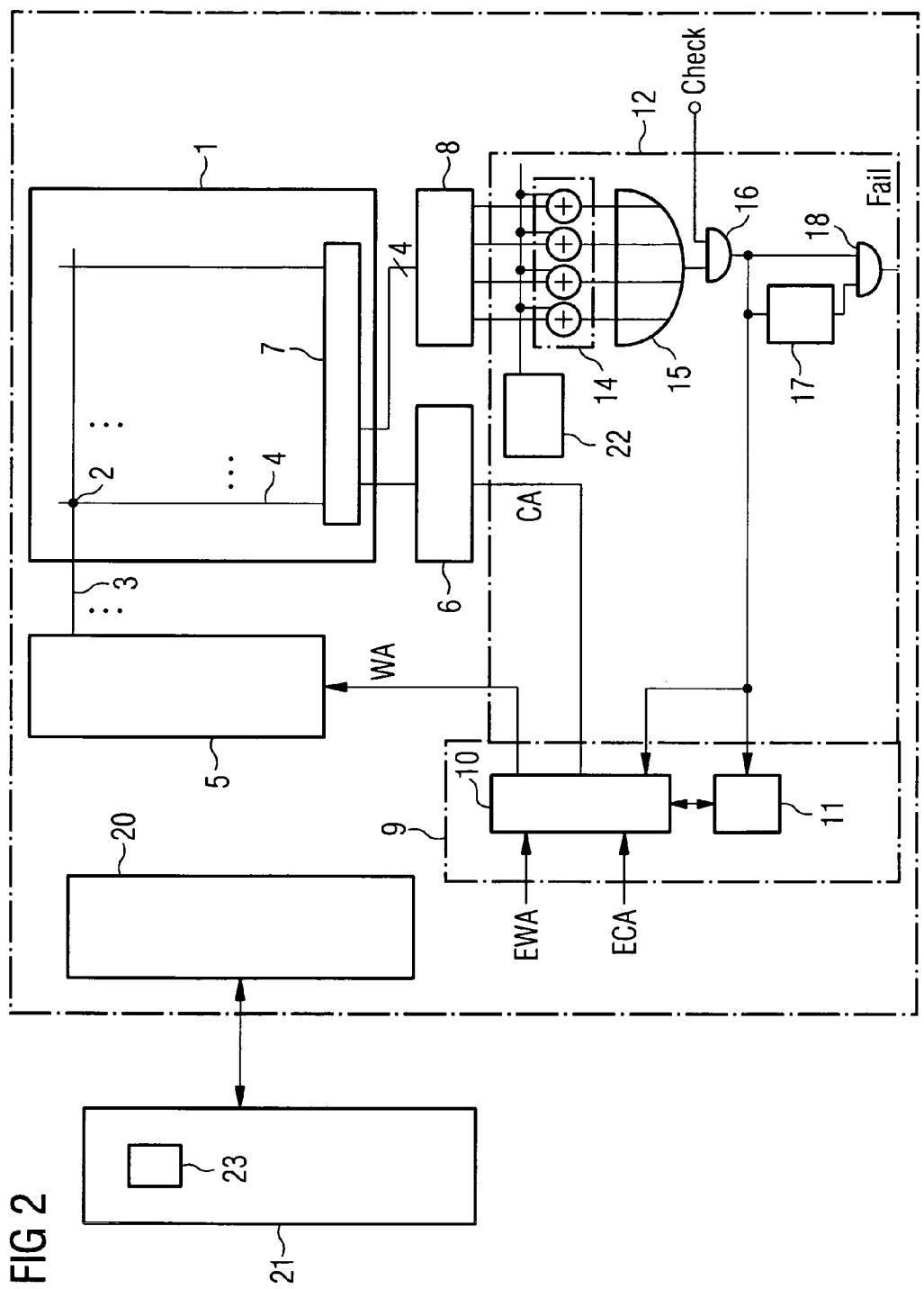
FIG. 2 shows a block diagram of an integrated memory circuit in accordance with a further preferred embodiment of the invention.

FIG. 2 illustrates a further embodiment of an integrated memory circuit according to the invention. The memory circuit shown in FIG. 2 differs from the embodiment shown in FIG. 1 in that no test control unit 13 and modification unit 19 are provided in the integrated memory circuit. The first and second test data are received externally from the outside, via an interface circuit 20 such as, for example, from a tester unit 21. The tester unit 21 supplies the first and second test data and receives the data read out from the memory cell array 1 after the writing of the first test data. The tester unit 21 has a test control unit and a modification unit 23 and essentially performs the functions of the test control unit 13 and of the modification unit 19 of the embodiment of FIG. 1, so that the test circuit which is provided in a manner integrated in the memory circuit in the embodiment of FIG. 1 can now be provided externally in a tester unit 21 in order thus to reduce the circuitry outlay of the integrated memory circuit. Identical elements or elements having an identical function with respect to the embodiment of FIG. 1 are provided with the same reference symbols in FIG. 2.

Via the interface unit 20, the memory circuit receives the first test data from the external tester unit 21 and writes them to the memory cell array 1. The data received via the interface unit 20 may additionally comprise address data in order to define the memory area to which the test data are intended to be written. As an alternative, an address counter (not shown) may be provided in the memory circuit and generates the address of the memory area that is currently to be written to. The first test data that have been written to the memory cell array 1 are then read out and output via the interface unit 20 to the external tester unit 21. In the modification unit 23 situated therein, the read-out data are modified in accordance with the manner described above such as is carried out in the modification unit 19 with regard to the embodiment of FIG. 1. The modified data are then written as second test data to the memory cell array 1 once again via the interface unit 20. The data then stored in the memory cell array 1 are read out via the second sense amplifier 8 into the comparator unit 14, where they are compared with expected data. The expected data are generated and provided in an expected data provision unit 22. In the case where the first test data are composed of data bits having the same states, the expected data are comparatively simple to generate since they can correspond to the correspondingly inverted data bits of the first test data. The processing of the comparison results from the comparator unit 14 is essentially effected, as was described in conjunction with FIG. 1, in the OR gate 15, the first AND gate 16, the latch 17, and also the second AND gate 18. Unlike in FIG. 1, the output of the first AND gate 16 is not connected to a test control unit, but rather directly to the assignment circuit 10 and the error address memory 11 of the repair circuit 9, where, when an error has been detected in the comparator unit 14, it is possible to store in the error address memory 11 a corresponding error address which corresponds to the memory area in which an error has been ascertained. The memory circuit and in particular the elements provided therein which are identical to the elements of the embodiment of FIG. 1 can essentially be formed in identical fashion and in the manner described above.

The test system comprising tester unit 21 and memory circuit as illustrated in FIG. 2 makes it possible to provide the memory circuit with an additional circuit portion having a small size for the repair of a single bit error, so that after the construction of a module it is possible to carry out repairs of errors that occur.

While the foregoing is directed to embodiments of the present invention, other and further embodiments of the invention may be devised without departing from the basic scope thereof, and the scope thereof is determined by the claims that follow.

What is claimed is:

1. An integrated memory circuit having a memory cell array comprising memory cells arranged on word lines and bit lines, and comprising:
    a repair circuit for repairing a single bit error in one of the memory cells, the repair circuit comprising:
        an error memory for storing an item of repair information; and
        an assignment unit in order, when accessing an address of the memory cell array, depending on the repair information, to access either a memory area of the memory cell array or a redundancy memory area, and
    a test unit for determining the repair information, the test unit comprising:
        a write unit, which successively writes first test data and second test data to a plurality of memory cells of a memory area of the memory cell array;
        a read-out unit which reads out data stored in the memory area;
        a modification unit in order to modify the bits of the read-out data to provide the second test data, which are subsequently written to the memory area by the write unit, and
        a comparator unit in order to compare the data read out after the writing of the second test data with expected data and to provide the repair information depending on the comparison result.

2. The integrated memory circuit of claim 1, further comprising: a test data provision unit being provided in order to provide the first test data as a bit sequence.

3. The integrated memory circuit of claim 2, wherein the test data provision unit provides the first test data as a bit sequence of identical logic states, and wherein the expected data provided to the comparator unit corresponds to inverted first test data.

4. The integrated memory circuit of claim 2, wherein the test unit is configured to determine repair information for different memory cells up to a predefined maximum number of memory cells.

5. The integrated memory circuit of claim 1, wherein the comparator unit modifies the read-out data in such a way that the position of each bit changes and each of the bits is inverted.

6. An integrated memory circuit having a memory cell array comprising memory cells arranged on word lines and bit lines, comprising:
   a repair circuit for repairing a single bit error in one of the memory cells, the repair circuit comprising:
       an error memory for storing an item of repair information;
       an assignment unit in order, when accessing an address of the memory cell array, depending on the repair information, to access either a memory area of the memory cell array or a redundancy memory area; and
   a test unit for determining the repair information, the test unit comprising:
       a write unit, which successively writes first test data and second test data to a plurality of memory cells of a memory area of the memory cell array;
       a read-out unit which reads out data stored in the memory area;
       a comparator unit in order to compare the data read out after the writing of the second test data with expected data and to provide the repair information depending on the comparison result;
       an interface unit in order to receive the first and second test data externally from the outside and to transmit the read-out data externally; and
       an expected data provision unit in order to provide the expected data.

7. The memory circuit of claim 6, wherein the repair circuit further comprises a programming circuit for writing to the error memory depending on the repair information.

8. The memory circuit of claim 6, wherein the test unit is configured to determine repair information for different memory cells up to a predefined maximum number of memory cells.

9. The memory circuit of claim 6, wherein the error memory is a permanent memory that stores the stored information independently of a presence of a supply voltage.

10. The memory circuit of claim 9, wherein the permanent memory comprises an electrical fuse.

11. A method for repairing a single bit error in an integrated memory circuit having a memory cell array, comprising:
    writing first test data to a memory area of the integrated memory circuit;
    reading out the data from the memory area;
    modifying the read-out data by inverting the data bits of the memory area and changing the data bits in terms of their respective positions;
    writing the modified data to the memory area;
    reading out the modified data from the memory area;
    comparing the read out modified data with expected data; and
    providing the repair information depending on a result of the comparison.

12. The method of claim 11, wherein the first test data is selected as a sequence of bits having identical logic states, and the expected data corresponds to the first test data.

13. The method of claim 11, wherein the repair information is permanently stored.

14. The method of claim 11, wherein one of a memory area of the memory cell array and a redundancy memory area is accessed when accessing an address of the memory cell array, depending on the repair information.

15. The method of claim 11, wherein the modifying is done by the integrated memory circuit.

16. The method of claim 11, wherein the modifying is done a device external to the integrated memory circuit.

* * * * *

UNITED STATES PATENT AND TRADEMARK OFFICE
CERTIFICATE OF CORRECTION

PATENT NO. : 7,372,750 B2  Page 1 of 1
APPLICATION NO. : 11/331577
DATED : May 13, 2008
INVENTOR(S) : Peter Poechmueller It is certified that error appears in the above-identified patent and that said Letters Patent is hereby corrected as shown below:

Column 6, Line 8, please delete "text" and insert --test--.

Signed and Sealed this

Sixteenth Day of September, 2008

JON W. DUDAS
*Director of the United States Patent and Trademark Office*